United States Patent
Ohmi et al.

(10) Patent No.: US 8,492,879 B2
(45) Date of Patent: Jul. 23, 2013

(54) SEMICONDUCTOR SUBSTRATE AND SEMICONDUCTOR DEVICE

(75) Inventors: Tadahiro Ohmi, Miyagi (JP); Akinobu Teramoto, Miyagi (JP); Tomoyuki Suwa, Miyagi (JP); Rihito Kuroda, Miyagi (JP); Hideo Kudo, Tokyo (JP); Yoshinori Hayamizu, Tokyo (JP)

(73) Assignees: National University Corporation Tohoku University, Miyagi (JP); Shin-Etsu Handotai Co., Ltd., Tokyo (JP)

( * ) Notice: Subject to any disclaimer, the term of this patent is extended or adjusted under 35 U.S.C. 154(b) by 482 days.

(21) Appl. No.: 12/681,576

(22) PCT Filed: Oct. 6, 2008

(86) PCT No.: PCT/JP2008/068183
§ 371 (c)(1),
(2), (4) Date: Apr. 2, 2010

(87) PCT Pub. No.: WO2009/044917
PCT Pub. Date: Apr. 9, 2009

(65) Prior Publication Data
US 2010/0213516 A1 Aug. 26, 2010

(30) Foreign Application Priority Data
Oct. 4, 2007 (JP) .................. 2007-261096

(51) Int. Cl.
*H01L 29/04* (2006.01)

(52) U.S. Cl.
USPC .......................... 257/628; 257/255

(58) Field of Classification Search
USPC ................................. 257/255, 628
See application file for complete search history.

(56) References Cited

U.S. PATENT DOCUMENTS

| | | | |
|---|---|---|---|
| 5,966,625 | A | 10/1999 | Zhong et al. |
| 6,559,518 | B1 | 5/2003 | Niwa |
| 7,411,274 | B2 | 8/2008 | Yamanaka et al. |
| 7,663,195 | B2 | 2/2010 | Ohmi et al. |
| 2006/0131553 | A1 * | 6/2006 | Yamanaka et al. ................ 257/1 |

FOREIGN PATENT DOCUMENTS

| | | |
|---|---|---|
| CN | 1748287 A | 3/2006 |
| EP | 0 746 041 A2 | 12/1996 |
| EP | 1 592 045 A1 | 11/2005 |
| JP | 2004-265918 A | 9/2004 |
| JP | 2004-356114 A | 12/2004 |

OTHER PUBLICATIONS

Chinese Patent Office office action on application No. 200880110286.1 dated Jan. 24, 2011; pp. 1-5.
Akinobu Teramoto et al., Very High Carrier Mobility for High-Performance CMOS on a Si(110) Surface, IEEE Transactions on Electron Devices, Jun. 2007, pp. 1438-1445, vol. 54, No. 6.

(Continued)

*Primary Examiner* — Ha Tran T Nguyen
*Assistant Examiner* — Raj R Gupta
(74) *Attorney, Agent, or Firm* — Foley & Lardner LLP

(57) ABSTRACT

On a surface of a semiconductor substrate, a plurality of terraces formed stepwise by an atomic step are formed in the substantially same direction. Using the semiconductor substrate, a MOS transistor is formed so that no step exists in a carrier traveling direction (source-drain direction).

4 Claims, 7 Drawing Sheets

OTHER PUBLICATIONS

Shin-Ichi Takagi et al., On the Universality of Inversion Layer Mobility in Si MOSFET's: Part I—Effects of Substrate Impurity Concentration, IEEE Transactions on Electron Devices, Dec. 1994, pp. 2357-2362, Vo. 41, No. 12.

Tadahiro Ohmi et al., Revolution Progress of Silicon Technologies Exhibiting Very High Speed Performance Over a 50-GHz Clock Rate, IEEE Transactions on Electron Devices, Jun. 2007, pp. 1471-1477, vol. 54, No. 6.

Yukinori Morita et al., Atomic Scale Flattening and Hydrogen Termination of the Si(001) Surface by Wet-Chemical Treatment, J. Vac. Sci. Technol. A, Vacuum, Surfaces and Films, pp. 854-858, May 1996, vol. 14, No. 3.

Tadahiro Ohmi, Total Room Temperature Wet Cleaning for Si Substrate Surface, Journal of the Electrochemical Society, Sep. 1996, pp. 2957-2964, vol. 143, No. 9.

Chung J. et al: "The Effects of Off-Axis Substrate Orientation on MOSFET Characteristics", Proceedings of the International Electron Devices Meeting, Washington, Dec. 3-6, 1989 [Proceedings of the International Electron Devices Meeting], New York, IEEE, US, Dec. 3, 1989, pp. 633-636, XP0000448283.

Extended European Search Report; EP No. 08835197.8-1552; date Apr. 23, 2013; 7 pages.

* cited by examiner

SEMICONDUCTOR SUBSTRATE AND SEMICONDUCTOR DEVICE

This application is the National Phase of PCT/JP2008/068183, filed Oct. 6, 2008, which claims priority to Japanese Application No. 2007-261096, filed Oct. 4, 2007, the disclosures of which are hereby incorporated by reference in their entirety.

TECHNICAL FIELD

This invention relates to a semiconductor substrate, such as a semiconductor wafer, and to a semiconductor device which is formed using the semiconductor substrate.

BACKGROUND ART

Conventionally, an asperity of a substrate surface on which a semiconductor device is formed is represented by using a statistic index, such as an average surface roughness (Ra) (Patent Document 1). Those values, such as 0.02 nm, 0.07 nm, 0.09 nm, and 0.11 nm, which are unrelated to surface atoms are used as the index. This is because there has been no technique of industrially flattening a semiconductor substrate surface at an atomic level and surface flattening has been performed by isotropic oxidation or the like (Non-Patent Document 1).

In the conventional method, it is impossible, in principle, to eliminate the asperity at the atomic level and, as a result, degradation in carrier mobility is induced in a semiconductor device due to a surface asperity (Non-Patent Documents 2 and 3). Meanwhile, as regards flattening of a silicon substrate surface, it is reported that the substrate surface inclined by approximately 4 degrees from a silicon crystal plane (100) is flattened at the atomic level by oxidation and etching with a strongly-acid solution with respect to a substrate surface (Non-Patent Document 4). It is also proposed that a (110) plane or a plane inclined from the (110) plane is flattened at the atomic level and provided with a step at the atomic level (Patent Document 2).

In the above-mentioned prior documents, no description is made about the problem addressed by the present invention and the means to solve the problem. The above-mentioned prior documents do not disclose a semiconductor substrate and a semiconductor device, in which steps and terraces are controlled in direction and width throughout a substantially entire area of the substrate surface to suppress degradation in carrier mobility due to the surface asperity.

Patent Document 1: JP-A-2004-356114
Patent Document 2: JP-A-2004-265918
Non-Patent Document 1: A. Teramoto et al., "Very High Carrier Mobility for High-Performance CMOS on a Si(110) Surface," IEEE Electron Devices, Vol. 54, No. 6, pp. 1438-1445, June 2007.
Non-Patent Document 2: S. Takagi et al., "On the universality of inversion layer mobility in Si MOSFET's: Part I-effects of substrate impurity concentration," IEEE Electron Devices, Vol. 41, No. 12, pp. 2357-2362, December 1994.
Non-Patent Document 3: T. Ohmi et al., "Revolutional Progress of Silicon Technologies Exhibiting Very High Speed Performance Over a 50-GHz Clock rate," IEEE Electron Devices, Vol. 54, No. 6, pp. 1471-1477, June 2007.
Non-Patent Document 4: Y. Morita et al., "Atomic scale flattening and hydrogen termination of the Si(001) surface by wet-chemical treatment," J. Vac. Sci. Technol. A, Vac. Surf. Film, Vol. 14, No. 3, pp. 854-858, May 1996.
Non-Patent Document 5: T. Ohmi, "Total room temperature wet cleaning Si substrate surface," J. Electrochem. Soc., Vol. 143, No. 9, pp. 2957-2964, September 1996.

DISCLOSURE OF THE INVENTION

Problem to be Solved by the Invention

In Non-Patent Document 4 and Patent Document 2 mentioned above, the substrate surface is flattened at the atomic level. However, it is impossible to control directions of steps and terraces and widths of the terraces at the atomic level. FIG. 1 shows STM (Scanning Tunneling Microscope) images of silicon surfaces. The normal silicon surface shown in FIG. 1(A) has a random surface structure and is not flattened at the atomic level. The silicon surface shown in FIG. 1(B) according to the technique of Non-Patent Document 4 is flattened at the atomic level. However, it is understood that the directions of the steps and the terraces and the widths of the terraces at the atomic level are not controlled. Further, in Non-Patent Document 4, no description is made at all about forming a semiconductor device on the surface and it is impossible to form the semiconductor device.

It is an object of the present invention to provide a semiconductor substrate and a semiconductor device, which are capable of controlling directions and widths of steps and terraces at the atomic level on a semiconductor substrate surface so as to suppress degradation in carrier mobility due to a surface asperity.

Means to Solve the Problem

According to the present invention, there is provided a semiconductor substrate wherein a substrate surface is provided with a plurality of terraces formed stepwise by an atomic step and formed in the substantially same direction.

According to the present invention, there is provided the above-mentioned semiconductor substrate wherein a crystal at the substrate surface is a silicon crystal and has (100) orientation.

According to the present invention, there is provided a semiconductor substrate wherein a substrate surface has the substantially same off angle throughout an entire surface of the substrate.

According to the present invention, there is provided a semiconductor substrate wherein a substrate surface has the substantially same off angle throughout an entire surface of the substrate and is provided with a plurality of terraces formed stepwise by an atomic step and formed in the substantially same direction.

According to the present invention, there is provided the above-mentioned semiconductor substrate wherein a crystal at the substrate surface is a silicon crystal and has (100) orientation.

According to the present invention, there is provided the above-mentioned semiconductor substrate wherein the terraces have the substantially same direction throughout a substantially entire surface of the substrate.

According to the present invention, there is provided the above-mentioned semiconductor substrate wherein the terraces have the substantially same width throughout a substantially entire surface of the substrate.

According to the present invention, there is provided a semiconductor device which is formed using the semiconductor substrate.

According to the present invention, there is provided a semiconductor device comprising a plurality of semiconductor elements formed on a semiconductor chip provided with a plurality of terraces formed stepwise by an atomic step and formed in the substantially same direction throughout substantially all portions of a semiconductor crystal surface.

According to the present invention, there is provided the semiconductor device wherein the semiconductor elements are formed so that carriers are transported in a direction substantially same as that of the terraces.

According to the present invention, there is provided the semiconductor device wherein the semiconductor elements are MOS transistors and each of the MOS transistors has a source-drain direction substantially same as that of the terraces.

According to the present invention, there is provided the semiconductor device wherein a crystal surface of the semiconductor chip is silicon and has (100) orientation.

According to the present invention, there is provided the semiconductor device wherein the terraces have the substantially same direction throughout a substantially entire surface of the semiconductor chip.

According to the present invention, there is provided the semiconductor device wherein the terraces have the substantially same width throughout a substantially entire surface of the semiconductor chip.

Effect of the Invention

According to the present invention, the directions of the terraces at the atomic level are controlled to be substantially same throughout a substantially entire area of the semiconductor substrate surface. As a result, it is possible to obtain a semiconductor device in which all semiconductor elements of the same size formed at different positions on a chip surface have the same characteristic while it was impossible in the past.

BEST MODE FOR EMBODYING THE INVENTION

Figure 3:
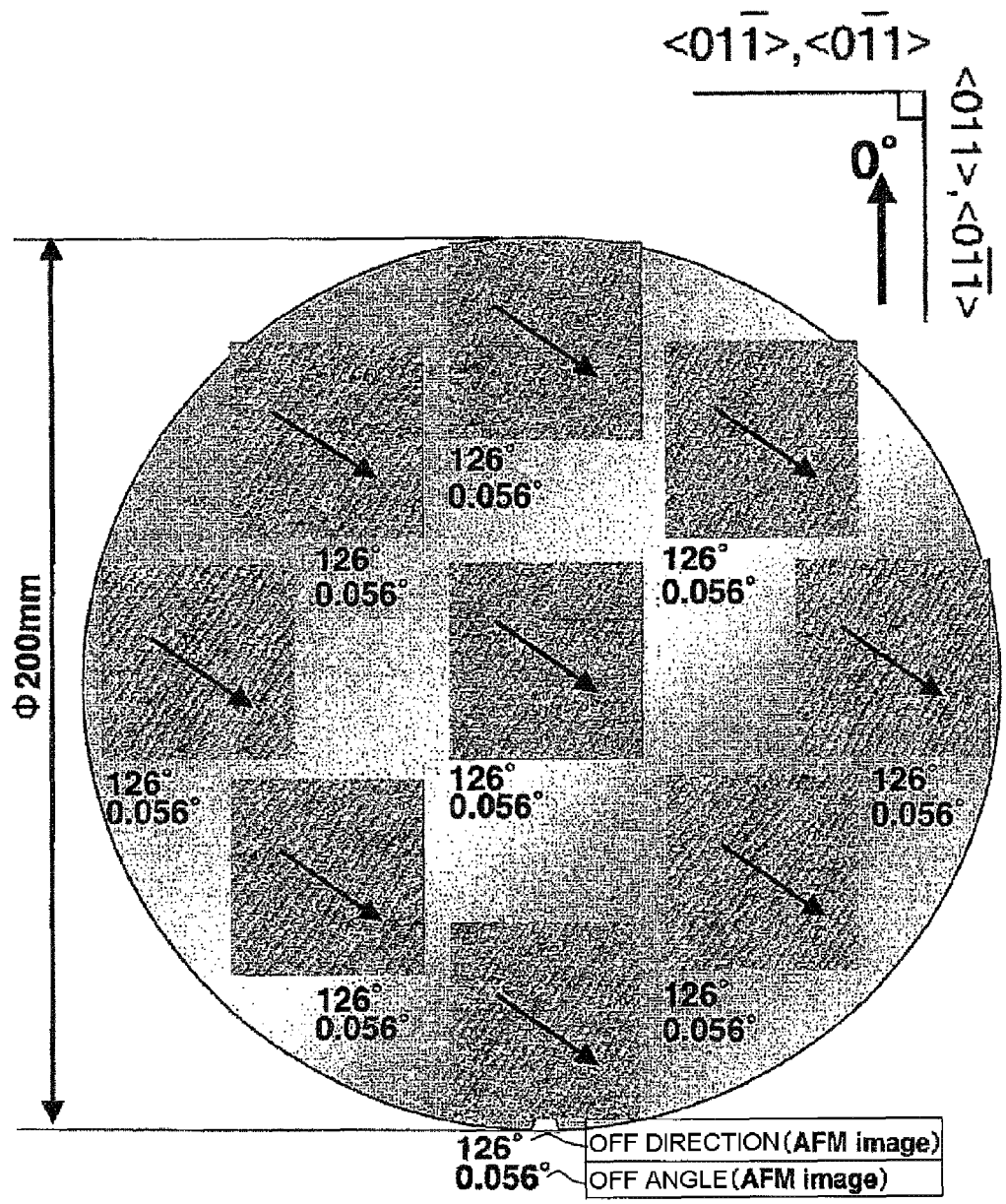
FIG. 3 shows AFM images of a semiconductor substrate surface in the present invention.
Figure 4A:
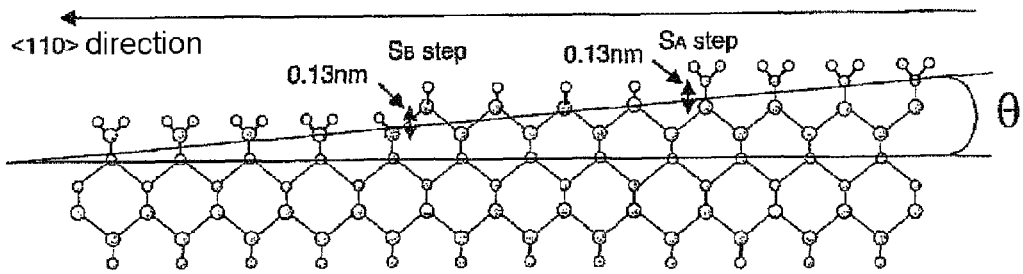
FIG. 4A is an atomic model view for describing steps and terraces in the present invention.
Figure 5:
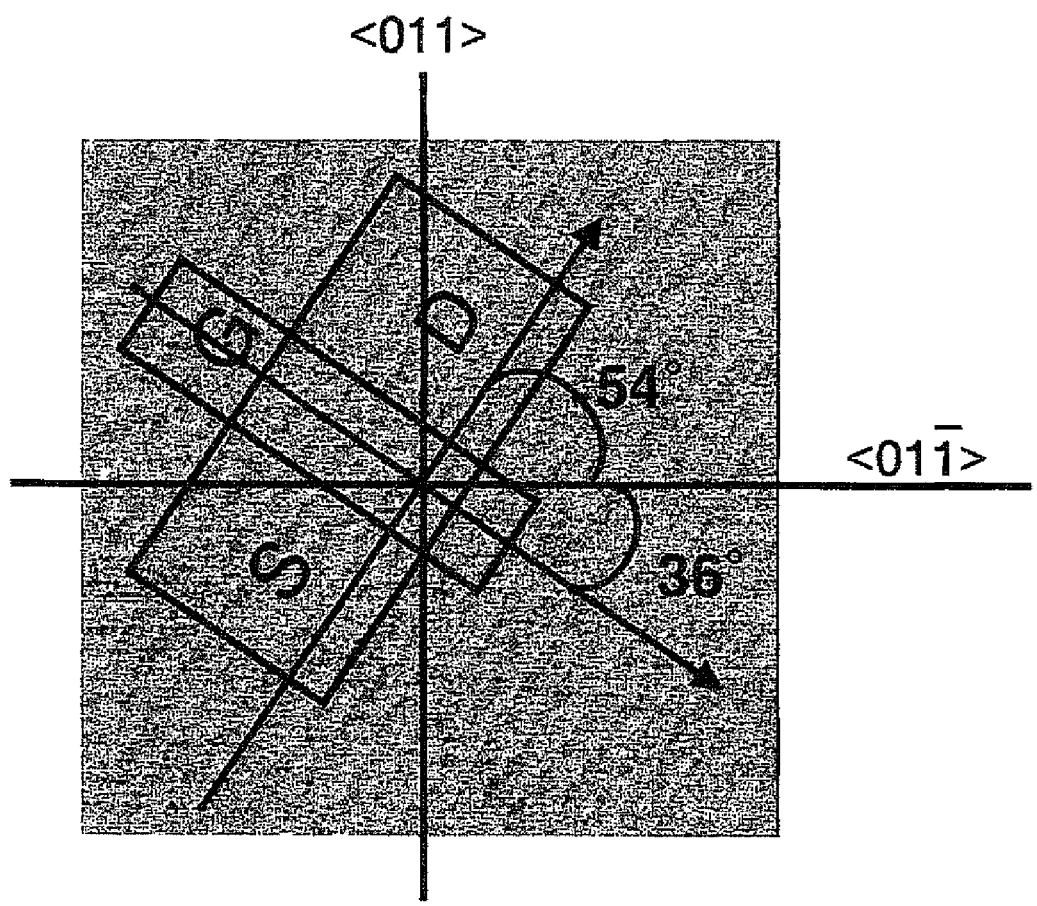
FIG. 5 is a plan view for describing a MOS transistor according to the present invention and a crystal direction.
Figure 6A:
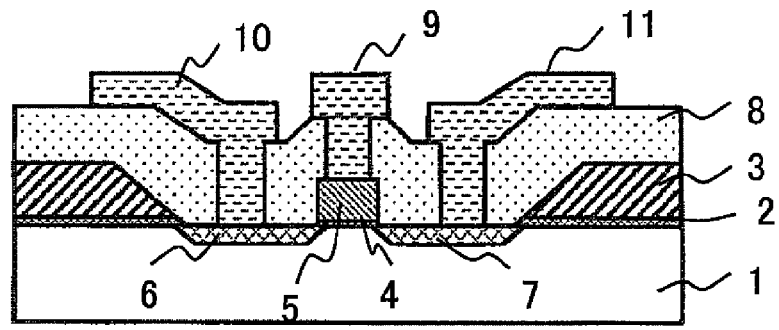
FIG. 6A is a sectional view of the MOS transistor according to the present invention.
Figure 6B:
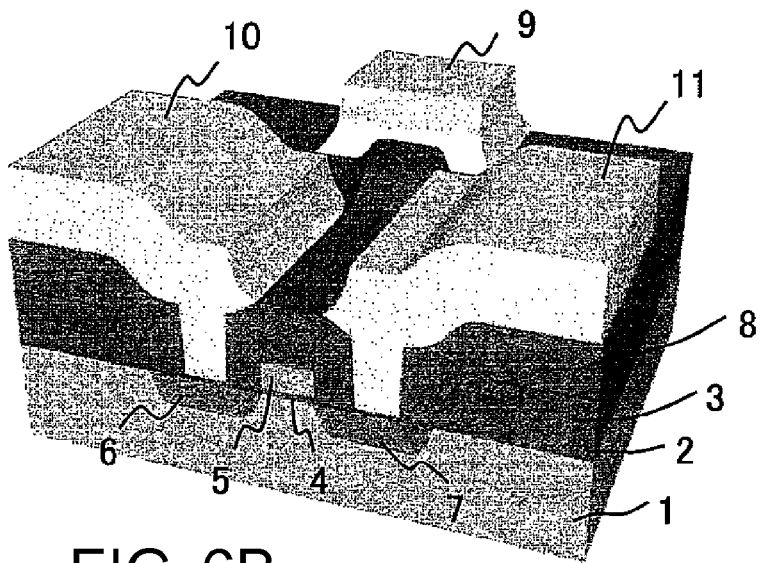
FIG. 6B is a three-dimensional overview of the MOS transistor according to the present invention.
Figure 6C:
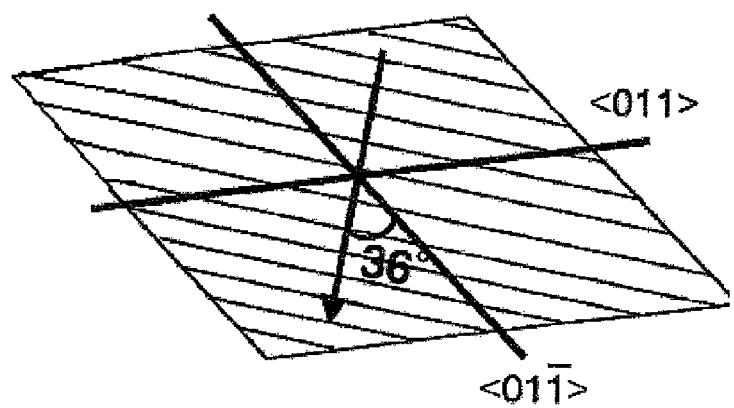
FIG. 6C is a crystal orientation view of a substrate of the MOS transistor according to the present invention.

Hereinbelow, an embodiment of a semiconductor substrate and a semiconductor device according to the present invention will be described in detail with reference to FIGS. 3 through 6. FIG. 3 shows AFM (Atomic Force Microscope) images of a substrate surface at different positions (9 points) on a silicon substrate. FIGS. 4(A), (B), and (C) show an atomic model (A), a schematic view (B) thereof, and a correlation diagram (C) of an off angle and an atomic step length (terrace width), for describing steps and terraces, respectively. FIG. 5 shows a plan view for describing a MOS transistor and a crystal direction. FIGS. 6 (A), (B), and (C) show a sectional view (A) and a three-dimensional overview (B) of the MOS transistor, and a crystal direction view (C) of a substrate respectively.

A silicon substrate is prepared in which a crystal at a substrate surface has a (100) plane and a plane orientation is inclined by 0.06° as an off angle with respect to the (100) plane in a direction inclined by 36° toward a <011> direction with respect to a <01-1> direction. The off angle is an angle evaluated by XRD (X-Ray Diffraction). The substrate surface is treated with a solution of $HF/H_2O=0.05\%$ to peel an oxide film on the surface and subjected to heat treatment (annealing) in an argon (Ar) atmosphere at 1200° C. for 30 minutes. As an annealing atmosphere, other inactive gases may be used instead of argon (Ar).

The AFM images of the silicon substrate surface are shown in FIG. 3. FIG. 3 shows the AFM images at one point of a central part of the semiconductor substrate and at eight points of peripheral parts of the substrate, which are obtained by generally equally dividing a circumference into eight segments. An off direction and an off angle at each point are shown at an upper row and a lower row, respectively. The peripheral parts at the eight points encompass a region except an outermost peripheral part of the substrate. By the nine points in total including the one point at the central part, it is possible to evaluate an entire surface of the substrate. A substantially entire surface of the semiconductor substrate may be a narrower region where a number of semiconductor elements are actually formed. It is understood that the AFM images at the nine points are substantially same and the surface of the entire substrate is flattened by a step/terrace structure uniformly extending in the same direction. In all of evaluation results at the nine points, an off direction is 126° and an off angle is 0.056°. Throughout the entire surface of the semiconductor substrate, terrace widths are the same and steps are formed in the same direction. Also, the off directions are the same and the off angles are the same throughout the entire surface of the semiconductor substrate. As mentioned above, the steps and terraces are periodically formed in the same direction throughout the entire surface of the semiconductor substrate.

Figure 4B:
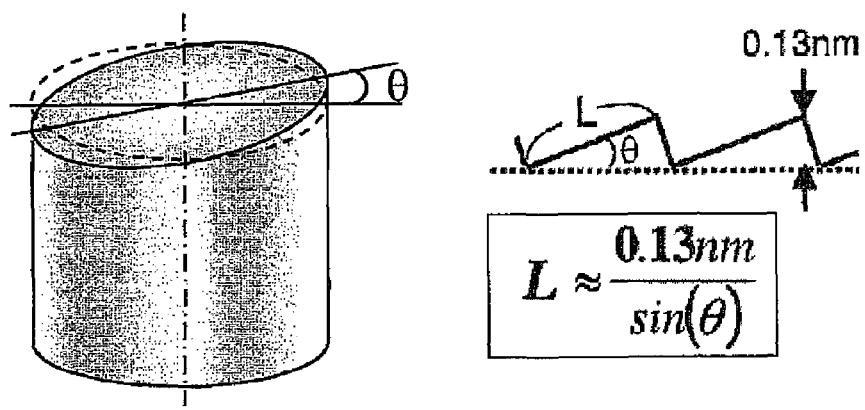
FIG. 4B is an atomic schematic view for describing the steps and the terraces in the present invention.

Referring to FIG. 4 in addition, the step/terrace structure will be described. Herein, a silicon surface is inclined by an off angle (θ) from a Just (100) plane. At the atomic level, in a case of inclination by the off angle (θ), lattice points on the surface are different as shown in FIG. 4(A). At positions where the lattice points on the surface are changed, steps $S_A$ and $S_B$ are formed. The steps have a height of 0.13 nm which is equal to a mono atomic step on the silicon (100) surface. As shown in FIG. 4(B), in a case of an off angle (0.06°), an average mono atomic step length is $L=0.13/\sin(0.06°)=124$ nm. The mono atomic step length L is equal to the terrace width.

At the atomic level, the terrace widths have variation of several atoms. However, the variation is as small as on the order of nm and falls within a range such that the influence on a characteristic is negligible or small. Therefore, the terrace widths are substantially same. Likewise the directions of the steps are not aligned in a straight line and have unevenness of several atoms at the atomic level. However, the unevenness is also as small as on the order of nm and falls within a range such that the influence on a characteristic is negligible or small. Accordingly, the directions of the steps are regarded to be substantially linear and aligned in one direction. Therefore, the steps are formed in the substantially same direction. Further, the off angles are the substantially same angle, similarly as an average angle. In the following description, it will simply be represented that the step directions are the same, the terrace widths are the same, and the off angles are the same.

Figure 4C:
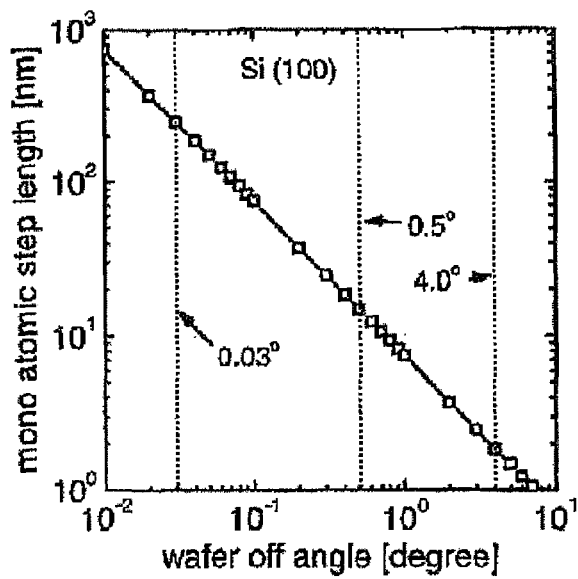
FIG. 4C is a correlation diagram of an off angle and a mono atomic step length (terrace width) for describing the steps and terraces in the present invention.

FIG. 4(C) shows a relationship between the off angle (θ) and a mono atomic step length (L) of the silicon (100) surface. A distance between the step $S_A$ and the step $S_B$ is the mono atomic step length which is the terrace width. The step has the height of 0.13 nm which is the mono atomic step on the silicon (100) surface and an average value of terrace widths having the off angle)(0.06°) is 124 nm (=0.13/sin(0.06°)). It is understood that average values of terrace widths having off angles of (0.03°), (0.5°), and (4.0°) are approximately 250 nm, 15 nm, and 2 nm, respectively. Thus, by the off direction (tilt direction) of the substrate with respect to the (100) plane, the step and the terrace directions can be controlled and, by the off angle (tilt angle), the terrace width can be controlled.

In the AFM images in FIG. 3, evaluation results are obtained which show that the off direction is 126° and the off angle is 0.056°. The silicon substrate prepared has the off angle of 0.06°. It is understood that the evaluated off angle of 0.056° falls within the tolerance from the preset off angle of 0.06° and these off angles well correspond with each other. The terrace widths are uniform and the same and the directions of the steps are linear. As mentioned above, by the off angle (θ), the terrace width=0.13/sin θ (θ: off angle) can be controlled. Thus, by setting the off direction and the off angle, it is possible to obtain a step/terrace structure which is linear and periodical in a specific direction.

Figure 1A:
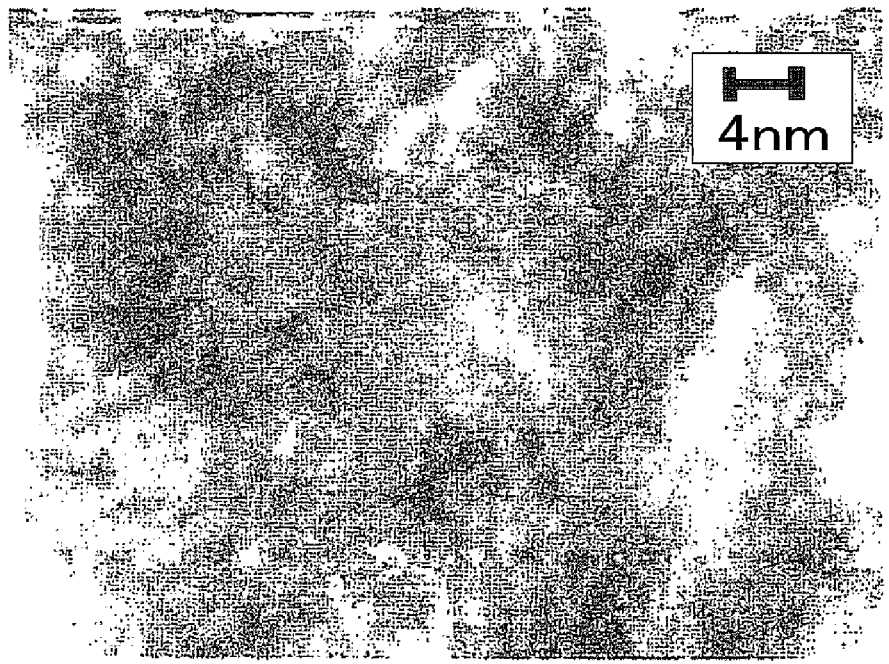
FIG. 1A shows an AFM image of a normal silicon substrate surface.
Figure 1B:
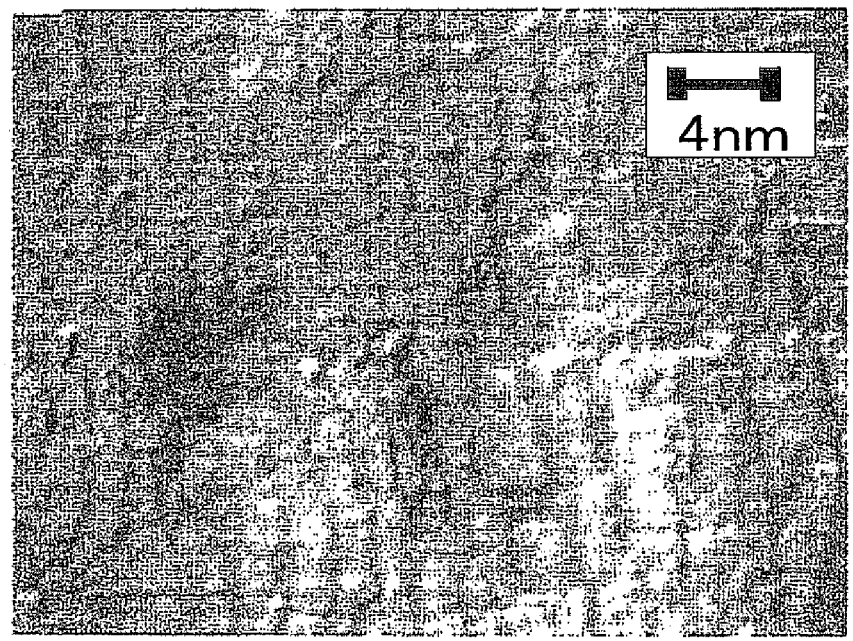
FIG. 1B shows an AFM image of a silicon substrate surface according to the technique of Non-Patent Document 4.
Figure 2A:
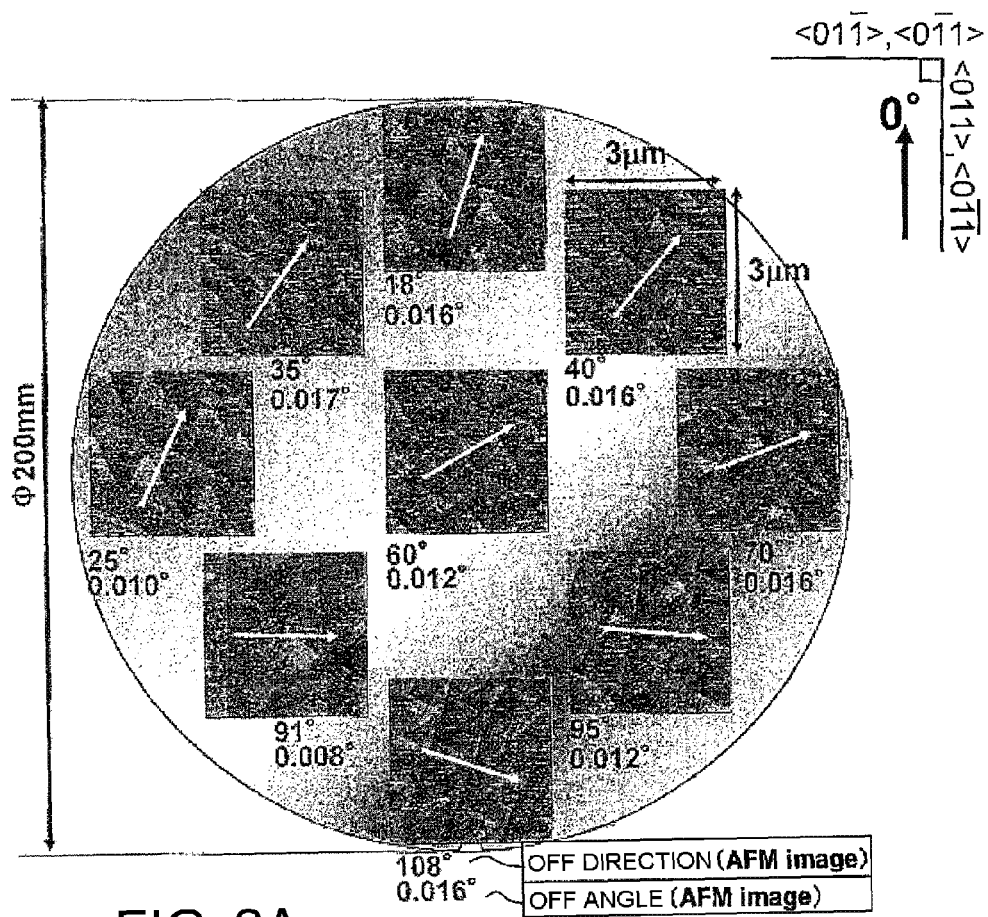
FIG. 2A shows AFM images of a semiconductor substrate surface when an off angle is 0.016°.
Figure 2B:
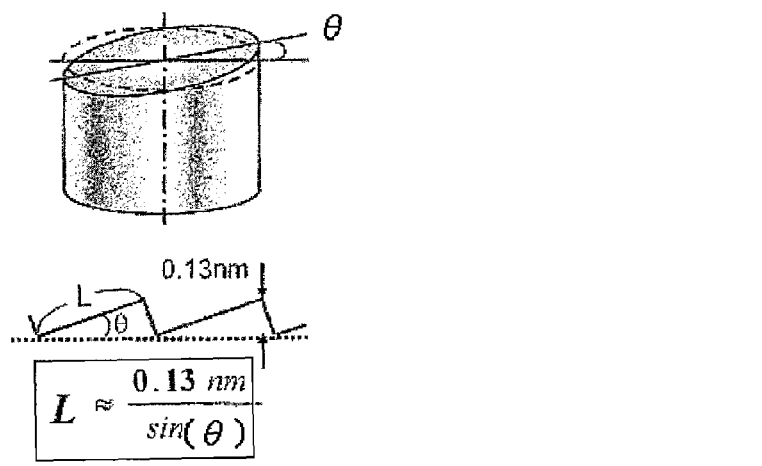
FIG. 2B is an atomic schematic view for describing steps and terraces.
Figure 2C:
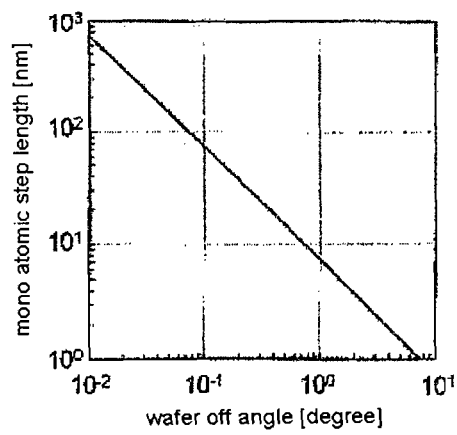
FIG. 2C is a correlation diagram of an off angle and a mono atomic step length (terrace width).

Now referring to FIG. 2, when the off angle (θ) is 0.016°, the off direction varies between 25° and 108° depending on a position on the substrate surface and the widths and the directions of the terraces vary also. It is understood that, by controlling the off angle, the substrate according to the present invention can be obtained in which the terraces are aligned in the same direction at any positions on the silicon substrate surface.

Referring to FIGS. 5 and 6, description will be made about a method of forming a MOS transistor using a semiconductor substrate 1 which is treated as illustrated in FIG. 3. As shown in FIG. 5, a carrier traveling (transport) direction (source-drain direction) of the MOS transistor is set to a direction in which roughness is extremely small and a carrier mobility is high. Specifically, the carrier traveling direction is set to a direction parallel to the steps so that the steps do not intersect with the carrier traveling direction. With this structure, it is possible to realize a MOS transistor having an extremely small roughness and a high carrier mobility in the carrier traveling direction.

A surface of the semiconductor substrate 1 subjected to the above-mentioned treatment is cleaned by a cleaning method using no alkaline solution (Non-Patent Document 5). A $SiO_2$ film 2 having a thickness of 7 nm is formed by radical oxidation in which a substrate surface is directly oxidized by oxygen radicals generated by plasma. Thereafter, a $SiO_2$ film 3 having a thickness of 300 nm is formed by CVD. An active region where the MOS transistor is to be formed is opened by photolithography. At this time, as shown in FIG. 5, a source (S)-drain (D) structure is set in a direction inclined toward a <011> direction by 54° with respect to a <01-1> direction so that no step exists in the source-drain direction.

Using photoresist as a mask material, the $SiO_2$ film 2 and the $SiO_2$ film 3 at an opening portion are removed by a solution of HCl/HF=19/1. The photoresist is removed by a solution of $H_2SO_4/H_2O_2$=4:1. The opening is formed at each of a plurality of (a number of) portions where transistors are to be formed, respectively. In FIG. 6, one of the opening portions and one of the transistors are shown. Thereafter, an exposed semiconductor surface is cleaned by the cleaning method using no alkaline solution. Then, by radical oxidation, a $SiO_2$ film 4 having a thickness of 5.6 nm is formed as a gate insulating film and polycrystalline polysilicon is formed as a gate electrode 5. Herein, the thickness of the gate insulating film is mentioned by way of example only. In a case of isotropic oxidation, such as radical oxidation, an interface flatness is not degraded regardless of a film thickness. Thereafter, the MOS transistor can be formed by a normal MOS transistor forming method. For example, the MOS transistor is formed by formation of a source diffusion layer 6 and a drain diffusion layer 7, deposition of an interlayer insulating film 8, opening of a contact hole, and formation of a gate extraction electrode 9, a source extraction electrode 10, and a drain extraction electrode 11.

FIG. 6 shows a sectional view (A) and a three-dimensional overview (B) of the formed MOS transistor, and a crystal orientation view (C) of the substrate respectively. The MOS transistor has the silicon substrate surface which is flat at the atomic level and has the source-drain structure formed in the direction inclined toward the <011> direction by 54° with respect to the <01-1> direction. Therefore, it is possible to realize the MOS transistor in which a silicon/gate-insulating-film interface is flat at the atomic level and which has an extremely low roughness and a high carrier mobility in the carrier traveling direction (source-drain direction). The steps and the terraces on the silicon surface are uniform throughout the entire substrate. Therefore, at any portion on the chip taken from any portion on the substrate, the MOS transistor has the same mobility.

There is no special limitation on the method of forming the MOS transistor. The gate insulating film may be formed by any method as long as the semiconductor substrate is isotropically oxidized or nitrided. As a technique of device isolation between a number of transistors thus formed, STI (Shallow Trench Isolation), LOCOS (Local Oxidation of Silicon), or the like may be used. As a method of cleaning a surface of the active region and a method of forming an oxide film or a nitride film, any method may be used as long as the film thickness of the similar level is obtained.

According to the present invention, it is possible to obtain the semiconductor substrate in which a plurality of terraces formed stepwise by an atomic step are formed in the substantially same direction throughout the substantially entire surface of the semiconductor substrate and in which the semiconductor substrate surface has the substantially same off angle. Using the semiconductor substrate, the MOS transistor is formed so that no step exists in the carrier traveling direction (source-drain direction). In the MOS transistor, carriers are free from degradation in carrier mobility due to the surface asperity of the substrate and have the same carrier mobility. As a result, it is possible to obtain the semiconductor device in which all semiconductor elements of the same size formed at different positions on a surface of a semiconductor chip have the same characteristic.

In the foregoing, the present invention has been described in detail based on the embodiment. However, it will readily be understood that the present invention is not limited to the above-mentioned embodiment and may be modified in various manners within the scope of the present invention.

This application claims priority based on Japanese Patent Application No. 2007-261096 filed on Oct. 4, 2007, the disclosure of which is incorporated herein in its entirety.

The invention claimed is:

1. A semiconductor substrate, wherein a substrate surface is provided with a plurality of terraces formed stepwise by an atomic step and has a terrace/step structure which is linear and periodical in a specific direction, wherein the substrate surface is a silicon (100) orientation surface which has the same off angle throughout the entire substrate surface and the plurality of the terraces are extended straight in the same specific direction and have the same widths, wherein the silicon (100) orientation surface has an off direction inclined toward a direction of <011> with respect to <01-1> direction and a predetermined of angle so as to realize the linear and periodical terrace/step structure.

2. The semiconductor substrate claimed in claim 1, wherein the off direction and the off angle are the same direction and the same angle, respectively, over the entire surface of the silicon (100) orientation surface.

3. The semiconductor substrate claimed in claim 2, wherein the off direction is equal to 36 degrees or 126 degrees while the off angle falls within, the range between 0.056 degree and 0.06 degree.

4. The semiconductor substrate claimed in claim 3, wherein the atomic step has a height of 0.13 nm while each terrace width is equal to 124 nm.

* * * * *